(12) United States Patent
Bieringer et al.

(10) Patent No.: US 9,835,686 B2
(45) Date of Patent: Dec. 5, 2017

(54) METHOD FOR MONITORING AN ON-LOAD TAP CHANGER

(71) Applicants: Alfred Bieringer, Geiselhoering (DE); Harald Hochmuth, Nittenau (DE); Dominik Plitzko, Regensburg (DE); Sebastian Schmid, Sinzing (DE)

(72) Inventors: Alfred Bieringer, Geiselhoering (DE); Harald Hochmuth, Nittenau (DE); Dominik Plitzko, Regensburg (DE); Sebastian Schmid, Sinzing (DE)

(73) Assignee: MASCHINENFABRIK REINHAUSEN GMBH, Regensburg (DE)

(*) Notice: Subject to any disclaimer, the term of this patent is extended or adjusted under 35 U.S.C. 154(b) by 89 days.

(21) Appl. No.: 14/379,710

(22) PCT Filed: Mar. 25, 2013

(86) PCT No.: PCT/EP2013/056250
§ 371 (c)(1),
(2) Date: Aug. 19, 2014

(87) PCT Pub. No.: WO2013/160046
PCT Pub. Date: Oct. 31, 2013

(65) Prior Publication Data
US 2015/0035538 A1    Feb. 5, 2015

(30) Foreign Application Priority Data

Apr. 27, 2012 (DE) .................. 10 2012 103 736

(51) Int. Cl.
G01R 31/02     (2006.01)
G01R 31/327    (2006.01)
H01H 9/00      (2006.01)

(52) U.S. Cl.
CPC ......... *G01R 31/327* (2013.01); *H01H 9/0005* (2013.01); *H01H 2009/0061* (2013.01)

(58) Field of Classification Search
CPC ......... H01H 9/0005; H01H 2009/0061; G01R 31/327
(Continued)

(56) References Cited

U.S. PATENT DOCUMENTS 6,100,674 A    8/2000  Dohnal et al.
6,124,726 A    9/2000  Dohnal
(Continued)

FOREIGN PATENT DOCUMENTS

DE      10344142 B      2/2005
DE     102010033195 B   11/2011

*Primary Examiner* — Patrick Assouad
*Assistant Examiner* — Demetrius Pretlow
(74) *Attorney, Agent, or Firm* — Andrew Wilford

(57) ABSTRACT

The invention relates to a method for monitoring an on-load tap changer that is used to switch between winding taps of a tapped transformer without interrupting the load current and is actuated using a motor drive. According to the invention, prior to the actual load switching process, the on-load tap changer is initially moved a short distance, preferably against the direction in which the load is subsequently switched. In said initial process, it is verified whether the on-load tap changer has moved, i.e. has left its previous stationary position, and/or whether the torque on the motor drive has exceeded a predefined threshold value. The actual load switching process takes place only once the test has yielded a positive result.

3 Claims, 1 Drawing Sheet

(58) Field of Classification Search
USPC ............ 324/415, 547, 764.01; 323/256, 340
See application file for complete search history.

(56) References Cited

U.S. PATENT DOCUMENTS

| | | | | |
|---|---|---|---|---|
| 2001/0013784 | A1* | 8/2001 | Frotscher | ............. H01H 1/0015 |
| | | | | 324/547 |
| 2006/0244431 | A1* | 11/2006 | Dohnal | ................ H01H 9/0027 |
| | | | | 323/258 |
| 2007/0057652 | A1* | 3/2007 | Hoffman | ................. G05F 1/147 |
| | | | | 323/258 |
| 2008/0129524 | A1* | 6/2008 | Kondo | .................... H01F 29/04 |
| | | | | 340/665 |
| 2008/0302639 | A1* | 12/2008 | Baertl | .................... H01H 19/62 |
| | | | | 200/18 |
| 2012/0169350 | A1* | 7/2012 | Bieringer | ........... G01R 31/3272 |
| | | | | 324/547 |
| 2013/0282312 | A1* | 10/2013 | Abeywickrama | .... G01R 31/027 |
| | | | | 702/58 |
| 2014/0167529 | A1* | 6/2014 | Teising | ................ H01H 9/0027 |
| | | | | 307/134 |
| 2015/0153749 | A1* | 6/2015 | Schmeckebier | ..... H01H 9/0005 |
| | | | | 323/340 |
| 2015/0171783 | A1* | 6/2015 | Kammerl | ............ H01H 9/0027 |
| | | | | 336/150 |
| 2015/0213777 | A1* | 7/2015 | Nicolas | .................. G09G 5/005 |
| | | | | 345/668 |

\* cited by examiner

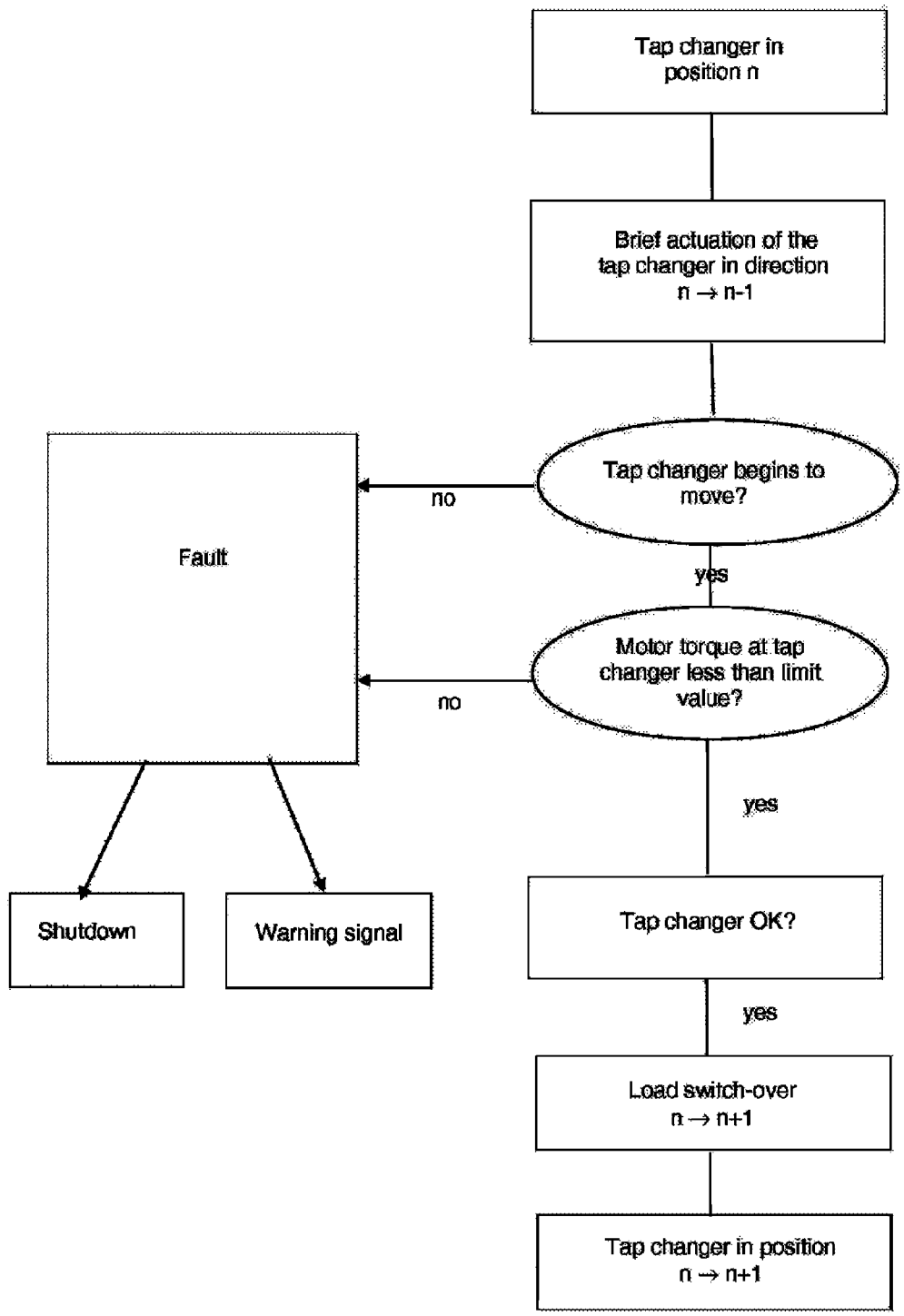

METHOD FOR MONITORING AN ON-LOAD TAP CHANGER

CROSS REFERENCE TO RELATED APPLICATIONS

This application is the US-national stage of PCT application PCT/EP2013/056250 filed 25 Mar. 2013 and claiming the priority of German patent application 102012103736.1 itself filed 27 Apr. 2012.

FIELD OF THE INVENTION

The invention relates to a method of operating a tap changer.

BACKGROUND OF THE INVENTION

Tap changers, also termed on-load tap changers, are known devices for uninterrupted switching between winding taps of a tapped (regulating) transformer. They serve, together with the tapped transformer, for voltage regulation of public or industrial energy supply and distributing mains. Tap changers are usually actuated by a motor drive and for each switching from one winding tap to another winding tap the motor drive is actuated and, in turn, actuates selector contacts, pre-selector/coarse-selector contacts and load changeover switch contacts in a defined switching sequence specific to the equipment. Tap changers are important apparatus for fault-free energy supply, for which regular functional monitoring is useful and in many cases is even offered so as to recognize functional disturbances in good time and to be able to initiate appropriate remedies or also safety measures close in time.

A method of monitoring a tap changer is known from DE 197 44 465 [U.S. Pat. No. 6,124,726], in which during the load changeover, i.e. during the actuation of the tap changer, the effective values of current and voltage at the drive motor of the motor drive are measured and the actual power is calculated from these values and in turn the torque determined therefrom. At the same time, in this known method a positional detection of the respective instantaneous setting of the tap changer during the switching-process is carried out; as a consequence, the respectively determined torques are associated with the position in which they have occurred. These value pairs are compared with previously stored target value pairs. In the case of deviations of the actual values from the target values beyond a certain threshold, reports are generated; in the extreme case the tap changer is stopped.

A further method of that kind is known from DE 197 46 574 [U.S. Pat. No. 6,110,674]. In this known method the entire switching-sequence in the case of actuation of the load changeover switch is divided into specific regions, so-called 'windows'; in each of these windows separate comparison of the actual values and the target values for the respective window with one another is undertaken. This method, known as 'window technique', is realized by the applicant in monitoring apparatus of the apparatus range TAPGUARD (Registered Trade Mark) it markets.

These known methods without exception operate retrospectively. The entire torque plot in the case of a load changeover at one winding tap to a new winding tap is initially stored. After the conclusion of the load changeover process a comparison of the corresponding actual and target values is possible. This applies just as much to the 'window technique'. Here, too, the values comparison of the individual windows takes place only after the end of the switching process.

In other words: if during a load changeover faulty functioning occurs the known methods can indeed signal this and prevent further future damage, but the faulty functioning triggering corresponding warning signals can itself no longer be 'undone'. In the extreme case this can lead to damage due to this faulty functioning.

OBJECT OF THE INVENTION

The object of the invention is to provide an improved method of function monitoring of and operating a tap changer.

SUMMARY OF THE INVENTION

This task is fulfilled by a method based on the general inventive idea of detecting and monitoring the instantaneous state of the tap changer already before the start of an intended load changeover and thus of ensuring that in the case of a functional disturbance the actual load changeover cannot even begin.

According to the invention this is achieved in that before the start of load switching process the motor drive initially drives the tap changer by a small amount in which actuation of the individual contacts still does not take place.

In that case it can be checked whether the tap changer actually moves. If it does not do so the drive train is interrupted, a blockage has occurred or another faulty function is present. This is signaled and the actual load switchover is not permitted.

Alternatively or additionally, the torque of the motor drive can also be detected. If it is equal to zero, the electrical connection is interrupted; the motor drive has not moved. If the torque is greater than a predetermined limit value a blockage of the motor or another faulty function is present. In such a case as well this can be signaled and load changeover prevented.

By the above-mentioned "small amount" by which the motor drive can initially actuate the tap changer for monitoring there can be understood, if the step motor is used, a few pulses. In the case of use of a conventional motor in motor drives, for example a three-phase asynchronous motor, there can be understood a very short time that, for example, is settable by a timer.

It is particularly advantageous within the scope of the invention to move, for the functional monitoring, the tap changer in a direction opposite to the switching direction for the intended later load changeover.

The method according to the invention shall be explained in more detail in the following by way of example.

BRIEF DESCRIPTION OF THE DRAWING

The sole FIGURE of the drawing is a schematic flow chart of the method according to the invention.

SPECIFIC DESCRIPTION OF THE INVENTION

In the starting position the tap changer is in the position n, i.e. it connects a (any) winding tap of the tapped transformer. Through a voltage regulator or the like it receives a command for a load changeover, here by way of example to the next tap n+1. The direction of the load changeover, i.e.

from n to n+1 or alternatively from n to n−1, derives from the information of the setting command to increase or reduce the voltage.

Before the start of the actual load changeover the tap changer is initially moved by a small amount in the opposite direction to the later load changeover, thus here in the direction n−1. The movement in opposite direction to the later load changeover is advantageous, but not necessary for the method according to the invention. A movement in this direction has the advantage of a higher acceleration for the subsequent load changeover due to the lengthened switch-over path.

The small amount of the explained movement before the actual load changeover can be realized, in the case of use of a step motor in the motor drive, in that the step motor receives only a few pulses. In the case of a usual drive motor this can be effected by application of current over only a very short period of time of, for example, 100 ms. The small amount of the movement is to be dimensioned in all cases in such a manner that actuation of individual components and contacts of the tap changer, which takes place in a specific switching sequence for the load changeover, is still not commenced.

On the basis of evaluation of the explained movement of the tap changer by a small amount the functional capability thereof can be determined even before the actual load changeover.

Thus, it can be detected whether, for example, the tap changer moves at all. This can be determined by checking whether it begins to leave its previous stationary position n, in that the corresponding reporting contact is interrogated.

The movement can also be determined by interrogation of an AOW sensor, a Hall sensor or an optical sensor.

If the tap changer does not move, a fault situation is present: the drive train is interrupted, the drive motor is defective or the like.

Alternatively or additionally it can be detected whether the torque at the drive motor in the case of the brief movement exceeds a limit value. This torque detection can be carried out mechanically, for example by a dynamo hub, or by evaluation, which is known from the prior art, of the load current. If the limit value is exceeded, a blockage, heavy motion or the like is present, thus a further fault situation.

If these evaluations have a positive result the tap changer is in order; subsequently, the actual load changeover begins until, in the example illustrated here, the new position n+1 is reached.

If a fault is recognized, there are basically two possibilities which the user can select: The tap changer can be stopped. Thus, no load changeover is possible until the fault is eliminated and a system reset undertaken. It is also possible to merely generate a warning report, but nevertheless permit further load changeovers, in certain circumstances limited to a specific number.

Overall, the method according to the invention enables functional monitoring not retrospectively after a load changeover, but prophylactically before a load changeover. This increases operational safety and reliability of the energy supply in that even prior to a possible fault in a load changeover process this is recognized and the tap changer can be stopped as a precaution. As a consequence, until elimination of the fault then further voltage regulations are indeed impossible, but consequential damage or breakdown of the voltage supply will not be expected to happen.

The invention claimed is:

1. A method of operating and monitoring operation of a tap changer actuated by a motor drive for, only when the tap changer is operating properly, switching between winding taps of a tapped transformer, the method comprising the steps of:
   after receipt of a setting command for load switching but prior to starting load-switching, prophylactically checking whether the tap changer is functioning correctly by
   activating the motor drive such that its contacts will not shift all the way to another tap,
   subsequently checking whether the tap changer has moved or torque at the motor drive has exceeded a predetermined limit value, and,
   if the tap changer has moved or the torque at the motor drive has not exceeded the limit value, starting the actual load switching to a new winding tap,
or
   if the tap changer has not moved or the torque at the motor drive has exceeded the limit value, generating a fault signal or stopping the tap changer.

2. The method according to claim 1, wherein after generation of the fault signal a predetermined number of load switchings is still permitted.

3. The method according to claim 1, wherein the motor drive comprises a step motor that for brief activation of the motor drive is excited by only a predetermined number of pulses.

* * * * *